(12) United States Patent
Hayashi

(10) Patent No.: US 8,817,480 B2
(45) Date of Patent: Aug. 26, 2014

(54) SEAL STRUCTURE

(75) Inventor: Takahiro Hayashi, Fujisawa (JP)

(73) Assignee: Nippon Mektron, Ltd. (JP)

( * ) Notice: Subject to any disclaimer, the term of this patent is extended or adjusted under 35 U.S.C. 154(b) by 179 days.

(21) Appl. No.: 12/988,432

(22) PCT Filed: Mar. 12, 2009

(86) PCT No.: PCT/JP2009/054752
§ 371 (c)(1),
(2), (4) Date: Oct. 18, 2010

(87) PCT Pub. No.: WO2009/139223
PCT Pub. Date: Nov. 19, 2009

(65) Prior Publication Data
US 2011/0031703 A1 Feb. 10, 2011

(30) Foreign Application Priority Data
May 13, 2008 (JP) .................................. 2008-125370

(51) Int. Cl.
H05K 5/00 (2006.01)
G01D 11/24 (2006.01)
H05K 1/18 (2006.01)
H05K 5/06 (2006.01)
H05K 1/03 (2006.01)
H05K 3/28 (2006.01)

(52) U.S. Cl.
CPC .............. *H05K 1/189* (2013.01); *H05K 1/0393* (2013.01); *G01D 11/245* (2013.01); *H05K 2203/1147* (2013.01); *H05K 3/284* (2013.01); *H05K 2201/10151* (2013.01); *H05K 5/069* (2013.01)
USPC ........... 361/752; 277/602; 277/626; 439/604; 174/50.5; 174/521

(58) Field of Classification Search
USPC .................................. 277/626, 602; 439/604
See application file for complete search history.

(56) References Cited

U.S. PATENT DOCUMENTS 4,825,876 A    5/1989  Beard
5,097,841 A *  3/1992  Moriuchi et al. ............. 600/488
(Continued)

FOREIGN PATENT DOCUMENTS

JP    2-5923 A      1/1990
JP    10-322049 A   12/1998
(Continued)

*Primary Examiner* — Kristina Fulton
*Assistant Examiner* — Eugene G Byrd
(74) *Attorney, Agent, or Firm* — Harness, Dickey & Pierce, P.L.C.

(57) ABSTRACT

In order to provide excellent waterproofness at a low manufacturing cost to a seal structure comprising a housing to which a flexible wiring board (1) is inserted and a seal member (3) integrally formed on said flexible wiring board (1) for hermetically sealing a gap between said housing and said flexible wiring board (1), a whole surface of a sensor member (31) arranged on at least one side of said flexible wiring board (1) is coated by same material as is used in said seal member (3), at a time of integrally forming the seal member (3) on the flexible wiring board (1).

15 Claims, 5 Drawing Sheets

(56) References Cited

U.S. PATENT DOCUMENTS

| | | | |
|---|---|---|---|
| 5,302,933 A * | 4/1994 | Kudo et al. | 338/18 |
| 5,927,725 A * | 7/1999 | Tabata et al. | 277/607 |
| 6,064,003 A * | 5/2000 | Moore et al. | 174/662 |
| 6,254,432 B1 * | 7/2001 | Yoshigi | 439/604 |
| 6,923,057 B2 * | 8/2005 | Sabatino | 73/313 |
| 2002/0101041 A1 * | 8/2002 | Kameyama | 277/628 |
| 2004/0119246 A1 * | 6/2004 | Woller et al. | 277/602 |
| 2012/0061919 A1 * | 3/2012 | Jiao | 277/314 |

FOREIGN PATENT DOCUMENTS

| | | |
|---|---|---|
| JP | 2000-307265 A | 11/2000 |
| JP | 2002-299850 A | 10/2002 |
| JP | 2003-142836 A | 5/2003 |
| JP | 2004-214927 A | 7/2004 |
| JP | 2006-093510 A | 4/2006 |

* cited by examiner

SEAL STRUCTURE

CROSS-REFERENCE TO RELATED APPLICATIONS

This is a national stage of International Application No. PCT/JP2009/054752 filed on Mar. 12, 2009 and published in the Japanese language. This application claims the benefit of Japanese Patent Application No. 2008-125370 filed on May 13, 2008. The disclosures of the above applications are incorporated herein by reference.

BACKGROUND OF THE INVENTION

1. Field of the Invention

The present invention relates to a sealing structure.

In more detail, the present invention relates to a sealing structure providing a waterproof construction of an electronic equipment and a connector.

2. Description of the Conventional Art

In recent days, a high waterproof function is demanded, while a downsizing is advanced, for a waterproof connector which is used in an electronic equipment such as a cellular phone, an automotive wiring harness and the like.

In order to provide the waterproof function to the electronic equipment constructed of a plurality of spaces, it is necessary to secure airtightness in housings constructing the respective spaces, and electrically connect the spaces with each other by a flexible board or the like.

In this case, there have been proposed a method of providing terminals in wall surfaces of the housings comparting the respective spaces, and connecting the terminals with each other by a wiring member, and a method of putting the wiring member through the wall surfaces of the housings and filling gaps generated between the wiring member and the housings with an adhesive agent or the like.

However, the mode that the terminals are provided in the wall surfaces of the housings has a problem that the equipment is enlarged in size.

The method of filling the gaps generated between the wiring member and the housings with the adhesive agent or the like causes a problem that a dissembling work and a reassembling work become hard.

Accordingly, as shown in FIGS. 3 to 5, there have been proposed such modes that seal members are integrally formed on a flexible wiring board (Japanese Unexamined Patent Publication Nos. 2003-142836 and 2004-214927).

In a mode shown in FIG. 3, frame body shaped seal members 301 corresponding to shapes of respective housings (not shown) are integrally formed with a flexible wiring board 100.

The flexible wiring board 100 extends through the respective seal members 301, and electronic parts are mounted within regions surrounded by the respective seal members 301.

Further, in a mode shown in FIG. 4, bush shaped seal members 303 are integrally formed with a flexible wiring board 100.

The seal members 303 are installed to insertion holes provided in respective housings (not shown).

Then, connectors 304 provided at both ends of the flexible wiring board 100 are electrically connected to electric parts within the housings.

Further, in a mode shown in FIG. 5, a bush shaped seal member 303 and a frame body shaped seal member 301 are integrally formed with a flexible wiring board 100.

Further, all the flexible wiring boards 100 shown in FIGS. 3 to 5 are provided with the following structure.

A printed wiring layer (a circuit pattern) constructed of a copper foil is bonded and fixed to at least one surface of a base board made of an elastic material such as a polyimide, a polyamide, a polyester, a liquid crystal polymer or the like.

Next, a cover film made of the same material as the elastic material used in the base board or a cover coat made of a solder resist is formed on a front face of the printed wiring layer, for protecting the front face.

As a result, the printed wiring layer is structured such as to be sandwiched by the base board and the cover film or the cover coat.

However, while all the flexible wiring boards 100 mentioned above are effective in a mode in which various sensors are set within the respective frame bodies of the housings (not shown), high functionalization has advanced in a field of a mobile equipment in recent years, and thus there arises a demand to arrange the various sensors or the like outside the respective frame bodies of housings (not shown).

Specifically, there is a demand for a mode in which various sensors or the like are arranged in a hinge portion of a cellular phone.

In this case, a strategy for waterproofing the various sensors or the like arranged outside the respective frame bodies of the housings (not shown) individually by a treatment such as dipping, coating or the like has been considered, however, there occurs such a problem that waterproofing between the seal members 301, 303 and the waterproof layer made by the coating or the like is insufficient, and a lot of man power is necessary.

SUMMARY OF THE INVENTION

Problem to be Solved by the Invention

The present invention is made by taking the points mentioned above into consideration, and an object of the present invention is to provide a sealing structure which has a good hermetical sealing performance and can be inexpensively manufactured, by coating various sensor members with a material of a seal member at a time of integrally forming the seal member on a flexible wiring board.

Means for Solving the Problem

In order to achieve the object mentioned above, in accordance with the present invention, there is provided a sealing structure comprising:

a housing to which a flexible wiring board is inserted; and a seal member integrally formed on the flexible wiring board for hermetically sealing a gap between the housing and the flexible wiring board, wherein a whole surface of a sensor member arranged on at least one side of the flexible wiring board is coated by a material which is used in the seal member.

Effect of the Invention

The present invention achieves effects as described below.

In accordance with the sealing structure of the present invention according to a first aspect, the sealing structure can be provided with a good waterproof performance and can be inexpensively manufactured by coating the various sensor members with the material of the seal member at a time of integrally forming the seal member on the flexible wiring board.

Further, in accordance with the sealing structure of the present invention according to a second aspect, it is particularly effective in the mode in which the sensor member is provided in a hinge portion of a cellular phone.

Further, in accordance with the sealing structure of the present invention according to a third aspect, it is particularly effective in the mode in which the seal member is constructed of a frame body shaped seal for sealing mating faces of the housing.

Further, in accordance with the sealing structure of the present invention according to a fourth aspect, it is particularly effective in the mode in which the seal member is constructed of a bush shaped seal installed to an insertion hole provided in the housing.

Further, in accordance with the sealing structure of the present invention according to a fifth aspect, it is particularly effective in the mode in which the seal member is constructed of a combination of the frame body shaped seal and the bush shaped seal.

DETAILED DESCRIPTION OF PREFERRED EMBODIMENTS

A description will be given below of preferable embodiments for carrying out the present invention.

The description will be given of the preferable embodiments for carrying out the invention on the basis of FIGS. 1 and 2.

Figure 1:
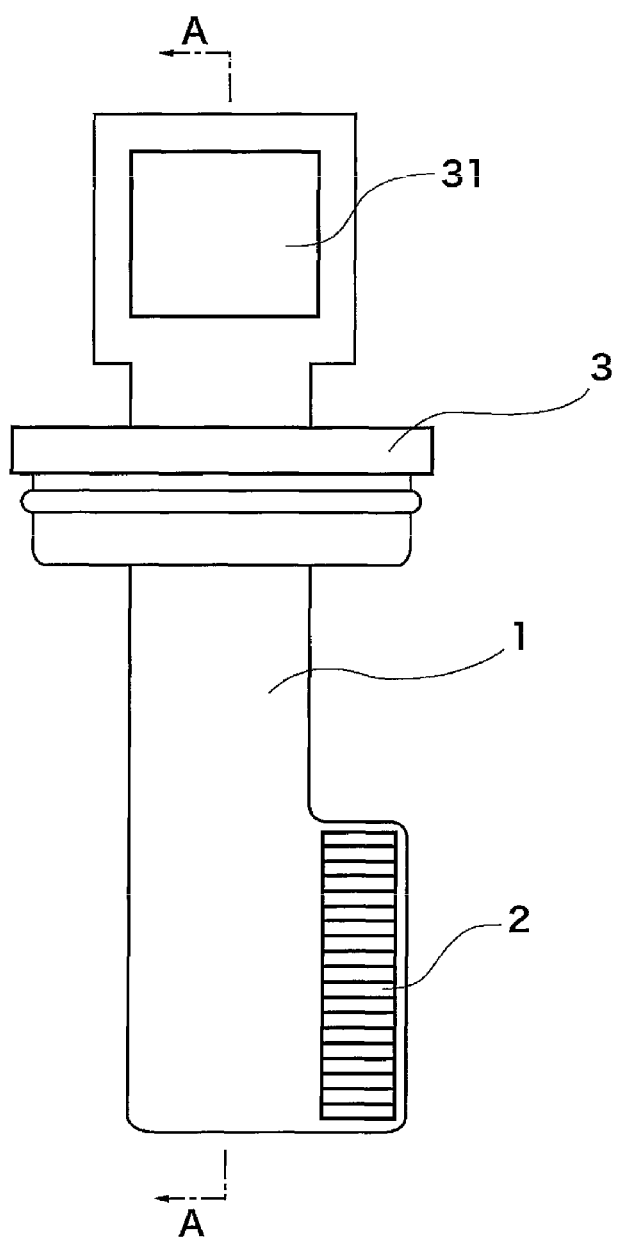
FIG. 1 is a plan view showing an embodiment of the seal structure in accordance with the invention.

FIG. 1 is a plan view showing an embodiment of the sealing structure in accordance with the invention.

Figure 2:
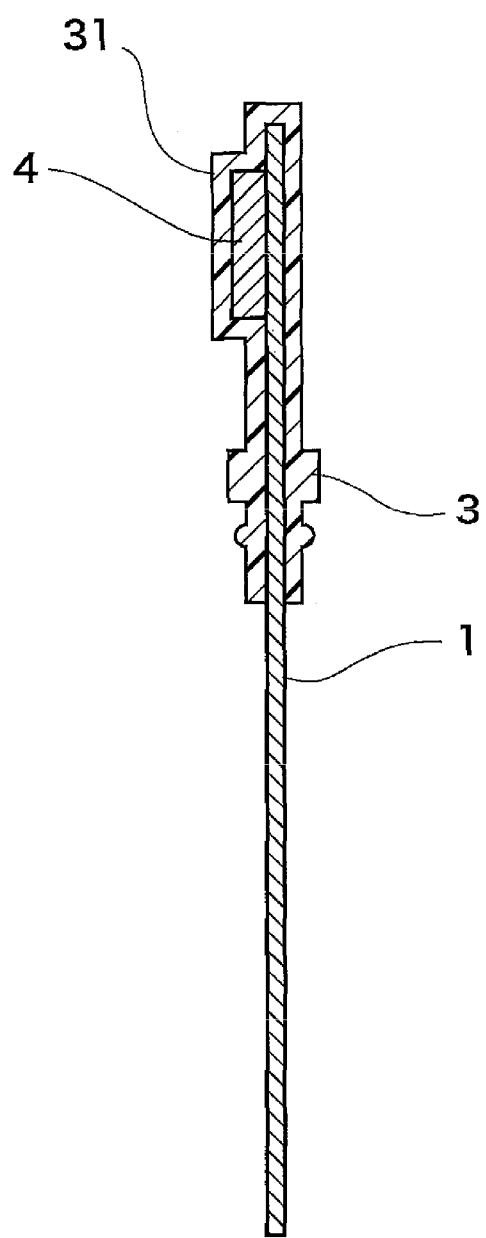
FIG. 2 is a sectional view along a line A-A in FIG. 1.

FIG. 2 is a sectional view along a line A-A in FIG. 1.

The sealing structure in accordance with the present invention is a sealing structure constructed of a housing (not shown) to which a flexible wiring board 1 is inserted, and a seal member 3 which is integrally formed on the flexible wiring board 1 to seal a gap between the housing and the flexible wiring board 1, and is structured such as to coat a whole surface of the sensor member 4 arranged on at least one side of the flexible wiring board 1 with a material used in the seal member 3.

Further, the seal member 3 in the middle of the figure is a bush shaped seal which seals a gap between an insertion hole provided in the housing and the flexible wiring board 1.

Further, the flexible wiring board 1 is provided with the following structure.

A printed wiring layer (a circuit pattern) constructed of a copper foil is bonded and fixed to at least one surface of a base board made of an elastic material such as a polyimide, a polyamide, a polyester, a liquid crystal polymer or the like.

Next, a cover film made of the same material as the elastic material used in the base board or a cover coat made of a solder resist is formed on a front face of the printed wiring layer, for protecting the front face.

As a result, the printed wiring layer is structured such as to be sandwiched by the base board and the cover film or the cover coat.

Further, a bonding sheet is interposed between the base board and the printed wiring layer.

The bonding sheet generally used is made by coating an adhesive agent on both surfaces of a PET film.

Further, it is possible to securely protect the printed wiring layer from rupture by reinforcing the bonding sheet with a glass fiber.

Further, for the seal member 3, an elastic material such as a self-adhering type silicone rubber, a TPE or the like is used.

On the other hand, a sensor member 4 is arranged at an upper side in the figure of the flexible wiring board 1.

Further, the sensor member 4 is covered by the coating layer 31 integrally formed with the material of the seal member 3 at the same time when the seal member 3 is formed by an injection molding, a compression molding or the like.

Accordingly, even if the sensor member 4 is positioned outside a frame body (at an upper side in the figure) of the housing (not shown), the sensor member 4 is not contaminated by water or the like.

Particularly, since the coating layer 31 is structured such as to be continuous with the seal member 3, water does not make an intrusion into the sensor member 4 through the gap between the coating layer 31 and the seal member 3.

Further, a connector 2 electrically connected to an electric part within the housing is provided at a lower side in the figure of the flexible wiring board 1 (in the frame body of the housing).

Further, the sensor member 4 is particularly effective in the mode of being provided in a hinge portion of a cellular phone.

Figure 3:
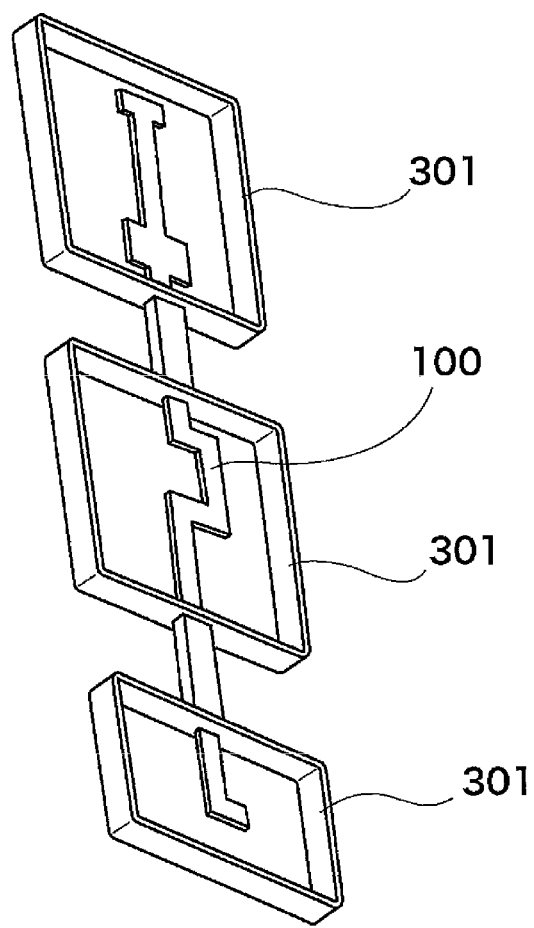
FIG. 3 is a plan view showing a seal structure in accordance with a prior art.
Figure 4:
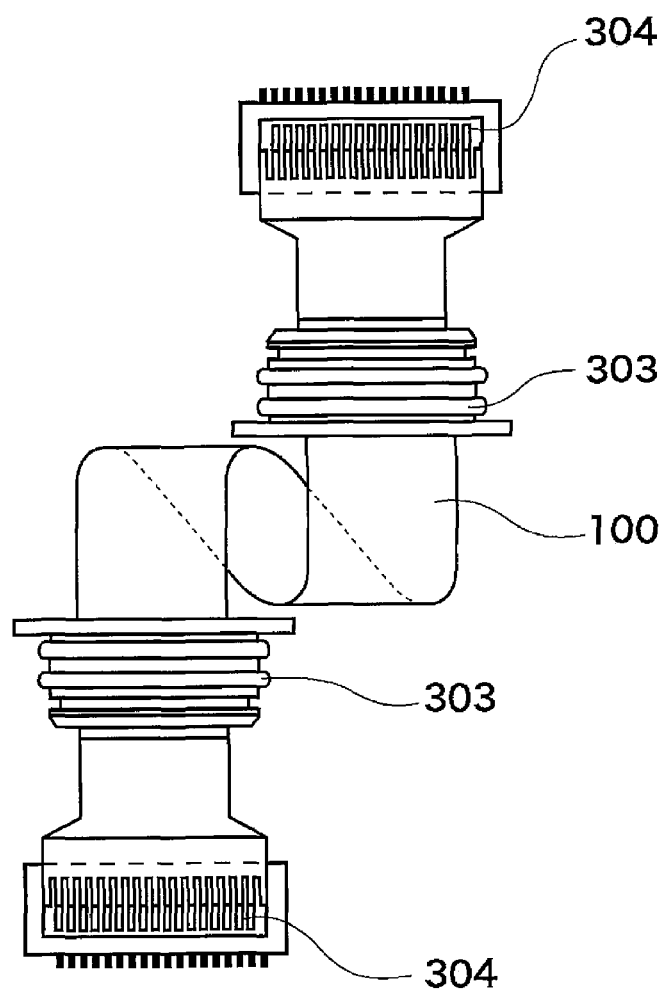
FIG. 4 is a plan view showing a seal structure in accordance with another prior art.
Figure 5:
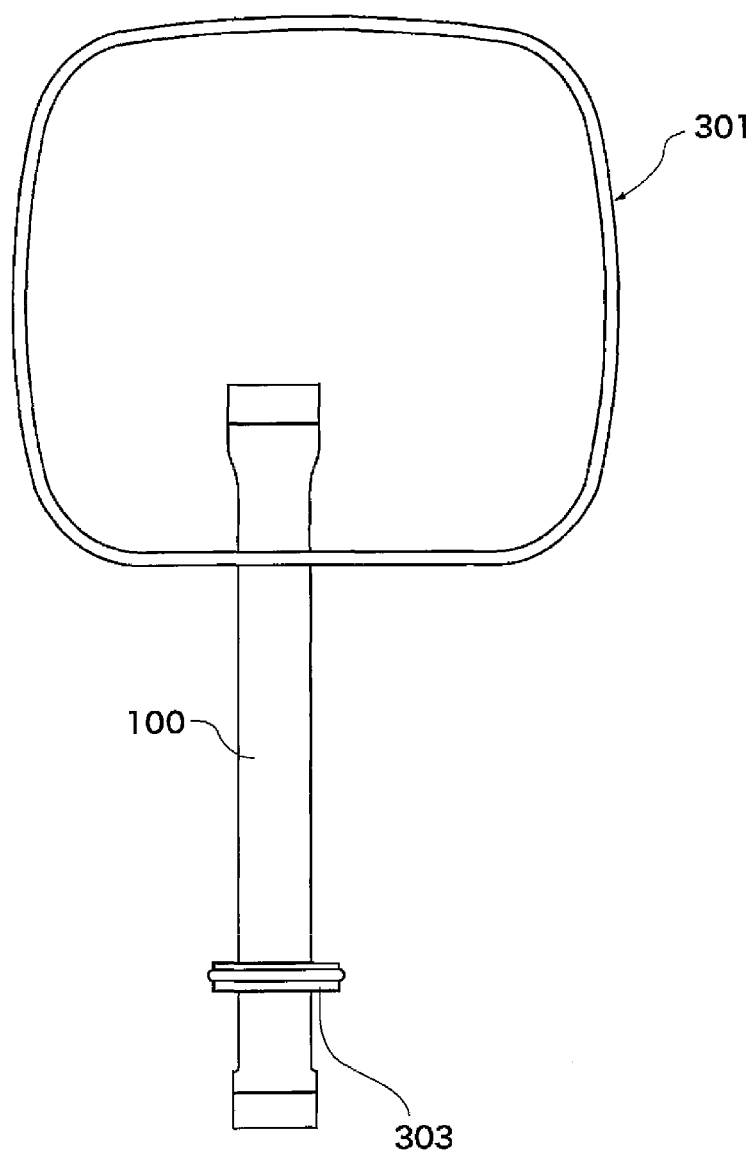
FIG. 5 is a plan view showing a seal structure in accordance with another prior art further.

Further, while the present embodiment exemplifies a mode of one piece of the bush shaped seal being used, the present invention may be applied in a mode of only frame body shaped seals for sealing mating faces of housings being used as shown in FIG. 3, may be applied in a mode of only bush shaped seals installed to insertion holes provided in housings being used as shown in FIG. 4, and may be applied in a mode of a frame body shaped seal and a bush shaped seal being combined as shown in FIG. 5.

Further, the housing may be a frame body of the cellular phone, or may be a connector housing.

Further, the shape of the seal member 3 may be in various shapes in addition to the frame body shaped seal and the bush shaped seal.

Further, the number of the seal member 3 attached to the flexible wiring board 1 is one in the embodiment, however, may be two or more in correspondence to the structure of the equipment to which the present invention is applied.

Further, needless to say the present invention is not limited to the preferred embodiments for carrying out the present invention as mentioned above, but may be applied in other various structural forms within the scope of the present invention.

What is claimed is:

1. A sealing structure comprising:
a flexible wiring board adapted to be inserted into a housing;
an elastic seal member integrally formed on said flexible wiring board, said seal member hermetically engaging said housing and hermetically engaging said flexible wiring board so as to form a hermetic seal of a gap between said housing and said flexible wiring board;
a sensor member arranged on at least one side of said flexible wiring board; and a coating layer coating an entire surface of said sensor member, said coating layer being:
the same material as said seal member;
integral with said seal member; and
one-piece continuous with said seal member.

2. A sealing structure as claimed in claim 1, wherein said sensor member is provided in a hinge portion of a cellular phone.

3. A sealing structure as claimed in claim 1, wherein said seal member is constructed of a frame body shaped seal for sealing mating faces of said housing.

4. A sealing structure as claimed in claim 1, wherein said seal member is constructed of a bush shaped seal installed to an insertion hole provided in said housing.

5. A sealing structure as claimed in claim 1, wherein said seal member is constructed of a combination of a frame body shaped seal and a bush shaped seal.

6. A sealing structure as claimed in claim 2, wherein said seal member is constructed of a frame body shaped seal for sealing mating faces of said housing.

7. A sealing structure as claimed in claim 2, wherein said seal member is constructed of a bush shaped seal installed to an insertion hole provided in said housing.

8. A sealing structure as claimed in claim 2, wherein said seal member is constructed of a combination of a frame body shaped seal and a bush shaped seal.

9. A sealing structure as claimed in claim 1, wherein said seal member and said coating layer comprise an injection molded elastic member.

10. A sealing structure as claimed in claim 1, wherein said seal member and said coating layer comprise a compression molded elastic member.

11. A sealing structure as claimed in claim 2, wherein said seal member and said coating layer comprise an injection molded elastic member.

12. A sealing structure as claimed in claim 2, wherein said seal member and said coating layer comprise a compression molded elastic member.

13. A sealing structure comprising:
a flexible wiring board adapted to be inserted into a housing;
an elastic seal member integrally formed on said flexible wiring board, said seal member hermetically engaging said housing and hermetically engaging said flexible wiring board so as to form a hermetic seal of a gap between said housing and said flexible wiring board;
a sensor member arranged on at least one side of said flexible wiring board; and
a coating layer coating an entire surface of said sensor member, said coating layer being:
the same material as said seal member;
integral with said seal member; and
one-piece continuous with said seal member,
wherein said sensor member is provided in a hinge portion of a phone,
wherein said seal member is constructed of one of:
a frame body shaped seal sealing mating faces of said housing;
a bush shaped seal installed to an insertion hole provided in said housing; and
a combination of said frame body shaped seal and said bush shaped seal, and
wherein said seal member and said coating layer comprise a molded elastic member.

14. A sealing structure as claimed in claim 13, wherein said seal member and said coating layer comprise an injection molded elastic member.

15. A sealing structure as claimed in claim 13, wherein said seal member and said coating layer comprise a compression molded elastic member.

\* \* \* \* \*